United States Patent
Zuliani et al.

(10) Patent No.: US 6,972,454 B2
(45) Date of Patent: Dec. 6, 2005

(54) PROCESS FOR MANUFACTURING A BYTE SELECTION TRANSISTOR FOR A MATRIX OF NON VOLATILE MEMORY CELLS AND CORRESPONDING STRUCTURE

(75) Inventors: Paola Zuliani, Milan (IT); Elisabetta Palumbo, Milan (IT); Marina Scaravaggi, Lorano (IT); Roberto Annunziata, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/715,887

(22) Filed: Nov. 18, 2003

(65) Prior Publication Data
US 2004/0152267 A1 Aug. 5, 2004

(30) Foreign Application Priority Data
Nov. 20, 2002 (IT) .......................... MI2002A2467

(51) Int. Cl.⁷ .......................................... H01L 29/788
(52) U.S. Cl. ................ 257/315; 257/316; 257/319; 257/326
(58) Field of Search ................ 257/315, 316, 257/319, 326; 438/257, 258, 672; 365/185.01

(56) References Cited

U.S. PATENT DOCUMENTS

| | | | | |
|---|---|---|---|---|
| 4,960,732 A | * | 10/1990 | Dixit et al. | 438/628 |
| 6,268,247 B1 | * | 7/2001 | Cremonesi et al. | 438/258 |
| 2002/0060349 A1 | * | 5/2002 | Libera et al. | 257/412 |

* cited by examiner

Primary Examiner—Mary Wilczewski
Assistant Examiner—Toniae M. Thomas
(74) Attorney, Agent, or Firm—Lisa K. Jorgenson; Harold H. Bennett, II; Seed IP Law Group PLLC

(57) ABSTRACT

In a matrix of non volatile memory cells integrated on a semiconductor substrate, each memory cell includes a floating gate transistor and a selection transistor formed in a first active area, while each byte includes a byte selection transistor formed in a second active area separated from the first by portions of insulating layer. A portion of a multilayer structure including a gate oxide layer, a first polysilicon layer, a dielectric layer, and a second polysilicon layer extends over the byte selection and selection transistors, forming the gate regions thereof, and further extending on a portion of insulating layer. A conductive layer is formed in an opening in the second polysilicon and dielectric layers, over the portion of insulating layer, putting the first polysilicon layer in electric contact with the second polysilicon layer. Another portion of the multilayer structure comprises the gate region of the floating gate transistor.

14 Claims, 2 Drawing Sheets

PROCESS FOR MANUFACTURING A BYTE SELECTION TRANSISTOR FOR A MATRIX OF NON VOLATILE MEMORY CELLS AND CORRESPONDING STRUCTURE

BACKGROUND OF THE INVENTION

1. Field of the Invention

The present invention relates to a process for manufacturing a byte selection transistor for a matrix of non volatile memory cells and corresponding structure.

More specifically, the invention relates to a process for manufacturing a byte selection transistor for a matrix of non volatile memory cells organised in rows and columns integrated on a semiconductor substrate, each memory cell comprising a floating gate transistor and a selection transistor, the process providing the following steps:

defining on a same semiconductor substrate respective active areas for said byte selection transistor, for said floating gate transistor and for said selection transistor split by portions of insulating layer;

depositing a multilayer structure comprising at least a gate oxide layer, a first polysilicon layer, a dielectric layer on the whole substrate and a second polysilicon layer.

The invention relates also to a circuit structure comprising a matrix of non volatile memory cells organised in rows and columns integrated on a semiconductor substrate, associated to a circuitry comprising high and low voltage transistors, each memory cell comprising a floating gate transistor and a selection transistor, said rows being interrupted by at least a couple of byte selection transistors, said transistors being manufactured in respective active areas delimited by portions of insulating layer.

The invention relates particularly, but not exclusively, to a process for manufacturing a byte selection transistor for a matrix of non volatile memory cells and the following description is made with reference to this field of application for convenience of illustration only.

2. Description of the Related Art

As it is well known, a matrix of non volatile memory cells comprises a plurality of non volatile memory cells integrated on a semiconductor material substrate arranged in rows and columns.

Each non volatile cell is formed by a floating gate transistor and by a selection transistor. The floating gate region of the floating gate transistor is formed on a semiconductor substrate and split therefrom by a thin gate oxide layer. A control gate region is capacitively coupled to the floating gate region by means of a dielectric layer and metallic electrodes are provided to contact the drain, source terminals and the control gate region in order to apply predetermined voltage values to the memory cell. The selection transistor is instead manufactured by means of a traditional MOS transistor comprising a gate region formed on a semiconductor substrate and split therefrom by a thin gate oxide layer. Source and drain regions are integrated in the substrate at the gate region ends.

The cells belonging to a same word line have a common electric line driving the respective control gates by means of the byte selection transistor, while the cells belonging to a same bit line have common drain terminals.

The matrix of memory cells is organized in turn in bytes, each one comprising 8 bits (or multiples). Each byte can be selected from outside the matrix by means of a byte transistor located in correspondence with each byte.

A first known technical solution to form a matrix of non volatile cells provides the use of two different masks for manufacturing the selection and byte transistors having a gate region with a single polysilicon level, while the gate region of the floating gate transistor is manufactured with a double polysilicon layer.

Therefore, in the matrix portion wherein the selection and byte transistors are manufactured a removal step of one of the two polysilicon layers used to form the double polysilicon layer must be performed.

Although advantageous under many aspects, this first solution has several drawbacks. In fact, the removal step of a polysilicon layer from the active areas of the selection and byte transistors of one of the two polysilicon layers can degrade the electric features of these devices. Moreover the resulting structure comprises the series of devices with different heights which make the cleaning steps provided in the traditional process flow particularly difficult.

SUMMARY OF THE INVENTION

According to principles of the present invention a process is described for manufacturing a byte transistor integrated in a matrix of non volatile memory cells, having such structural and functional features as to allow the number of masks to be used in the manufacturing process to be reduced overcoming the limits and/or drawbacks still affecting prior art devices.

The solution idea underlying the present invention is to form the gate region of the byte selection transistor using the same two overlapped layers which are used for the gate regions of the selection transistor and for the gate regions of the floating gate transistor and to form the electric connection between these two polysilicon layers near the byte transistor.

The features and advantages of the device according to the invention will be apparent from the following description of an embodiment thereof given by way of non-limiting example with reference to the attached drawings.

DETAILED DESCRIPTION OF THE INVENTION

With reference to these drawings, a process for manufacturing a byte selection transistor for a matrix of non volatile memory cells is described.

The present invention can be implemented together with other integrated circuit manufacturing techniques presently used and well known in this field, therefore only those commonly used process steps which are necessary to understand the present invention are included together with the description of the invention.

The figures representing views of integrated circuit portions during the manufacturing are not drawn to scale, but they are instead drawn in order to show the most important features of the invention.

Figure 2:
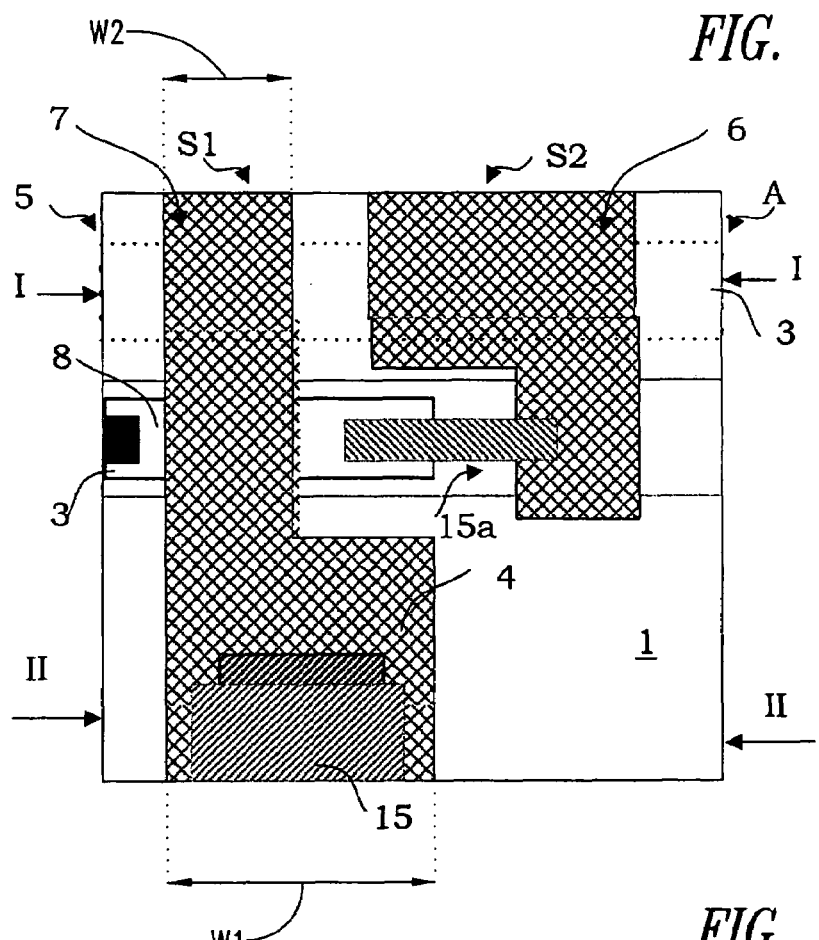
FIG. 2 shows a magnification of a portion A of the matrix of cells of FIG. 1 comprising a byte selection transistor according to the invention.
Figure 3:
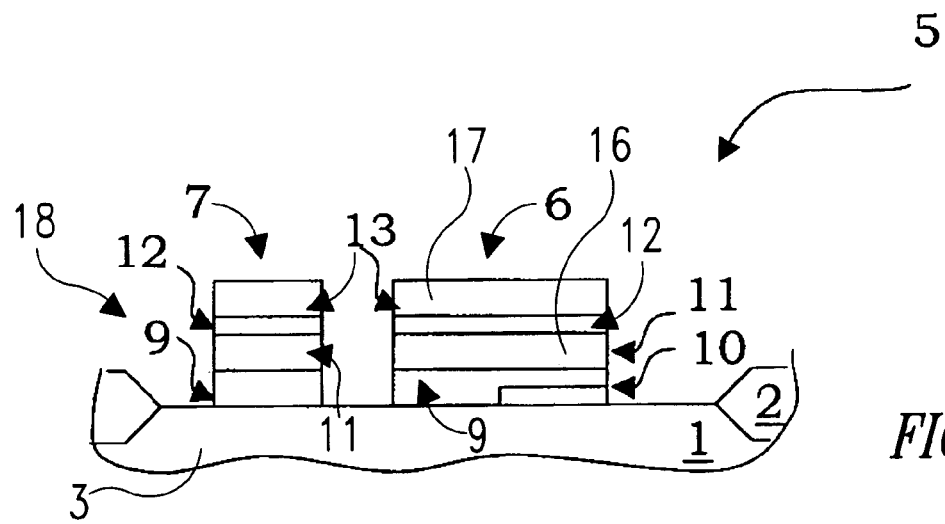
FIG. 3 is a sectional view along the line I—I of FIG. 2 of a traditional memory cell.

With reference to FIG. 2–3, a thick oxide layer 2 is selectively formed, for example grown, on a semiconductor substrate in order to form active areas 3 wherein the non volatile memory cells 5 are respectively formed, each one comprising a floating gate transistor 6 and a selection transistor 7 and byte selection transistors 8. The oxide layer 2 can also be a trench or other isolation structure.

As shown in FIG. 3, a second oxide layer 9 of a first thickness is formed to form the gate oxides of the floating gate transistor 6, of the selection transistor 7 and of the byte selection transistor 8. In some embodiments, a third oxide layer 10 of a second thickness being less than the thickness of the second layer 9 to form the tunnel oxide of the floating gate transistor 6 is selectively formed.

Traditionally, in this process step the gate oxide layer of high voltage transistors comprised in the matrix control circuitry, not shown in the drawings, is also formed by means of the second oxide layer 9.

A layered structure 18 is then formed on the whole substrate 1 comprising a first polysilicon layer 11, a fourth dielectric layer 12 called interpoly oxide and a second polysilicon layer 13.

This fourth dielectric layer 12 is for example an ONO (Oxide-Nitride-Oxide) layer.

Advantageously, in this process steps after depositing the fourth dielectric layer 12, called interpoly oxides a fifth oxide layer is also formed, to form the gate oxide layer of low voltage transistors, which can be used to manufacture other types of memory devices on the same substrate 1, such as for example ROM or SDRAM memories, and the devices implementing the matrix control logic, not shown in the drawings.

Advantageously, by forming this fifth oxide layer last, the devices implementing the low voltage control logic are manufactured with a manufacturing process not depending on the process used for the memory matrix and high voltage devices. It is thus possible to perform an optimization of manufacturing process parameters of single devices.

This layered structure 18 is selectively removed, as shown in FIG. 2, by means of a photolithographic process providing the use of a self-aligned etching mask, to form simultaneously the gate regions of the floating gate transistor 6, of the selection transistor 7, and of the byte selection transistor 8.

Two bands S1 and S2 are thus formed on the substrate 1. The band S1, corresponding to the respective active areas 3 of the selection transistor 7 and to the byte selection transistor 8, forms the respective gate regions thereof, while the band S2, corresponding to the respective active area 3 of the floating gate transistor 6, form the gate region thereof.

According to the invention, the band S1 extends over the byte transistor 8 on the oxide layer 2 in order to form a pad 4.

This pad 4 is used to put the first polysilicon layer 11 in contact with the second polysilicon layer 13.

Advantageously, the width W1 of the pad 4 is greater than the width W2 of the portion S1 which forms the gate regions of transistors 7 and 8.

In other words, the band S1 has an enlarged portion between adjacent byte selection transistors.

Figure 4:
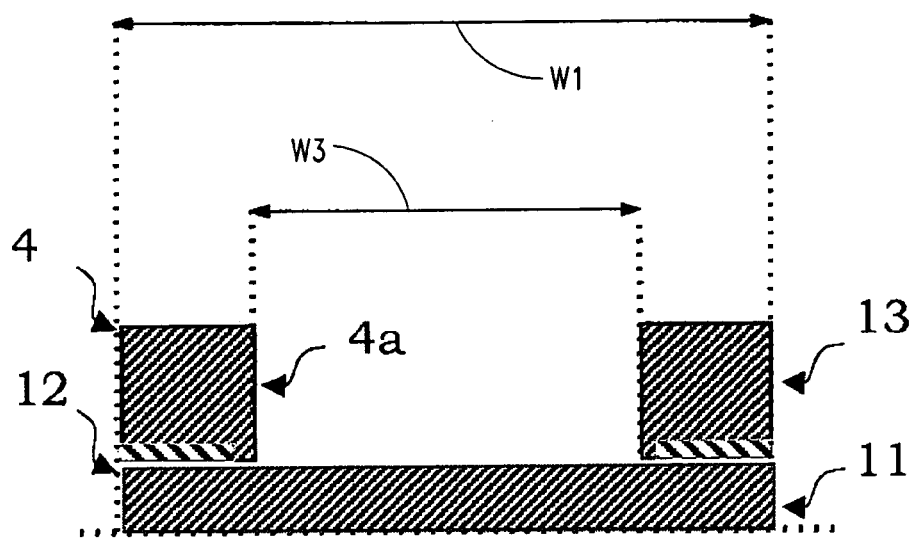
FIGS. 4 and 5 are sectional views along the line II—II of a matrix portion of FIG. 2 during the two different steps of the manufacturing process.
Figure 5:
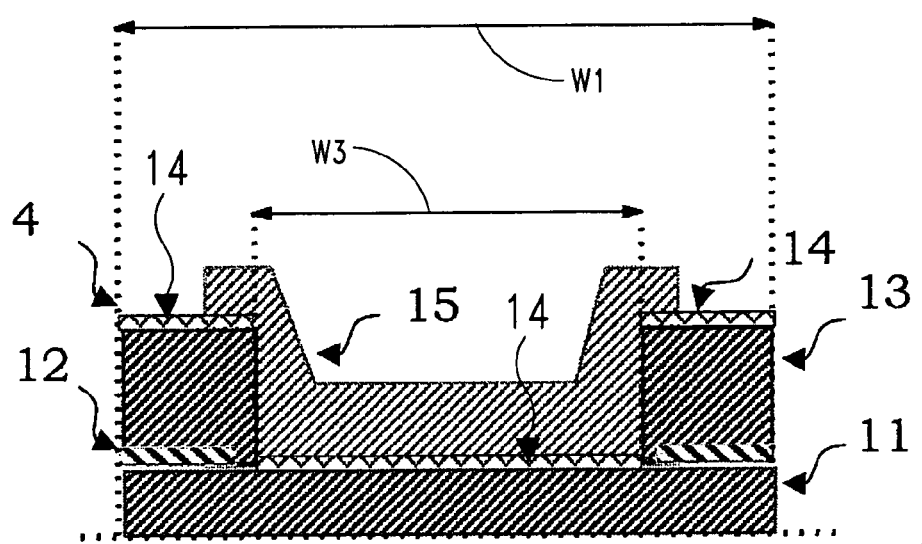

In particular, as shown in greater detail in FIGS. 4 and 5, according to the invention an opening 4a exposing the dielectric layer 12 is formed in the second polysilicon layer 13, having a width W3 within said pad 4.

This dielectric layer 12 is then removed through the opening 4a formed in the second polysilicon layer 13.

Advantageously, this opening 4a is formed in the same process step in which the gate regions of transistors of the low voltage circuitry associated with the matrix are manufactured.

At this point the process continues with the dopant implantation steps provided by the traditional process flow to form the junctions of matrix transistors.

Advantageously, the process then continues with the formation of a metal layer 14 on the whole substrate 1 surface. A thermal treatment is then performed to let the metal layer react with the substrate 1 surface and with the polysilicon layers 11 and 13 which are not covered by dielectric to form a silicide layer.

During the thermal treatment, the transition metal 14 only reacts with that substrate 1 portion not comprising an oxide layer. Therefore the second polysilicon layer 13 and the portion of the first polysilicon layer 11 exposed through the opening 4a are thus covered by a low resistance layer.

The interconnection lines used in the matrix of cells are formed at this stage. In particular, a conductive layer 15 is formed in the opening 4a formed in the second polysilicon layer 13 in order to fill at least partially said opening 4a. The conductive layer 15 puts the first polysilicon layer 11 in electrical contact with the second polysilicon layer 13, as shown in FIG. 5.

Advantageously, a portion 15a of the conductive layer 15 can be formed in other to locations, for example, to put a junction of the byte selection transistor 8 in contact with the gate region of the floating gate transistor 6 of the memory cell 5.

The conductive layer 15 can be a further polysilicon layer or a metallization layer.

Figure 1:
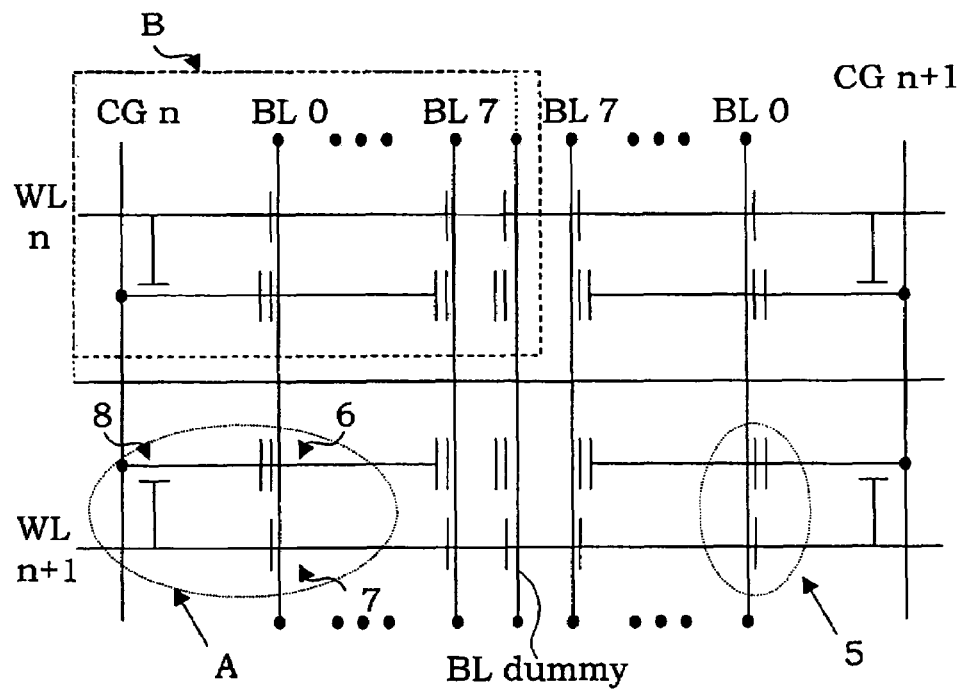
FIG. 1 shows a simplified diagram of a wiring diagram of a matrix of non volatile memory cells comprising bit and byte selection transistors.

The circuit structure according to the invention is now described, comprising a matrix of non volatile memory cells, for example of the EEPROM type. This matrix comprises a plurality of non volatile memory cells 5 integrated on a semiconductor material substrate 1 arranged in rows, or word lines W, . . . , WLn, WLn+1 and columns or bit lines B0, . . . , BL7, as shown in FIG. 1. Traditionally, a dummy reference column BL dummy is between two adjacent bytes.

Each non volatile cell 5 is formed by a floating gate transistor 6 and by a selection transistor 7. The floating gate region 16 of the floating gate transistor 6 is formed on a semiconductor substrate 1 and split therefrom by means of a gate oxide layer 9 and sometimes tunnel oxide layer 10. A control gate region 17 is capacitively coupled to the floating gate region 16 by means of a dielectric layer 12, and metallic electrodes are provided to contact the drain, source terminals and the control gate region, for example CGn, GCn+1, in order to apply predetermined voltage values to the memory cell.

The cells 5 belonging to a same word line have a common electric line driving the respective control gate regions by means of the byte selection transistor 7, while the cells 5 belonging to a same bit line have common drain terminals.

Also, the control circuitry of the matrix of memory cells, traditionally comprising high voltage transistors to handle the signals in the matrix of memory cells 1 is integrated on the same substrate 1.

The matrix of memory cells is organized in turn in bytes B, each one comprising 8 bits (or multiples). Each byte can be selected from outside the matrix by means of a respective byte selection transistor 8 corresponding to each byte. Each byte selection transistor 8 is formed in a corresponding active area 3 delimited by a thick oxide layer 2.

According to the invention, the gate regions of floating gate transistors 6, of selection transistors 7, and of byte selection transistors 8 are formed by means of a multilayer structure 18 formed on the semiconductor substrate 1, comprising a first oxide layer 9, a first polysilicon layer 11, a second oxide layer 12, and a second polysilicon layer 13. In particular, this multilayer structure 18 comprises a first band S1 common to all selection transistors 7 belonging to the same word line and to the relevant byte selection transistor 8, and a second band S2 common to all floating gate transistors 6 belonging to the same byte. A portion 4 of the band S1 also extends on the thick oxide layer 2 delimiting the active area 3 of the byte selection transistor 8.

In particular, the band S1 corresponding to the respective active areas 3 of the selection transistor 7 and byte selection transistor 8 forms the respective gate regions thereof, while the band S2 corresponding to the respective active areas 3 of the floating gate transistors 6 forms the respective gate regions thereof.

Advantageously, the portion 4 can have a greater width W1 than the width W2 of the portion of the band S1 forming the gate regions of selection transistor 7 and the byte selection transistor 8 corresponding to the active areas 3 of these transistors. In fact this portion 4 can have a pad shape.

The second dielectric layer 12 and the second polysilicon layer 13 are provided with an opening 4a corresponding to the pad 4. Advantageously, the second polysilicon layer 13 and the portion of the first polysilicon layer 11, exposed through the opening 4a, are covered by a low resistivity layer 14, such as, for example, a silicide layer.

According to the invention, a conductive layer 15 fills, at least partially, the opening 4a, forming the electric connection between the first and second polysilicon layers 11, 13.

In conclusion, with the process according to the invention, a particularly compact circuit structure is obtained, since the pad 4, which is used to put the two polysilicon layers forming the gate regions of transistors 7, 8 in electric contact, and thus ensure the correct operation of these devices, is formed between two byte selection transistors 8 belonging to two adjacent bytes. The distance provided between two adjacent byte selection transistors 8 is selected in order to reduce the formation of parasite transistors between these two adjacent transistors which have to handle high voltages.

The further advantage of the present invention is to manufacture transistors in the matrix with a same number of polysilicon layers in order to facilitate the etching and selective removal steps being necessary during the manufacturing process steps. Forming all gate regions in the same process step considerably improves the reliability of the so-formed devices.

Advantageously, the circuit structure according to the invention allows very compact devices to be manufactured, such as for example SmartCard products, or devices which can be used in mobile telephony applications which must have a low voltage interface with the outside. Traditionally, the driving of the memory matrix in the circuit structure according to the invention is instead handled by high voltage transistors.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit structure, comprising:
   a semiconductor substrate having thereon circuitry including high and low voltage transistors; and
   a matrix of non volatile memory cells organized in rows and columns integrated on the semiconductor substrate, each memory cell having a floating gate transistor and a selection transistor, said rows being interrupted by at least a couple of byte selection transistors, said transistors being manufactured in respective active areas delimited by portions of an insulating layer, said circuit structure having a first and a second multilayer band formed on said semiconductor substrate, each band having a first gate oxide layer, a first polysilicon layer, a second dielectric layer and a second polysilicon layer, said first band defining the gate regions of said byte selection transistor and of said selection transistor in correspondence with said respective active areas and having a portion extending on a portion of the insulating layer adjacent to said byte selection transistor, said second band defining the gate regions of said floating gate transistor, wherein said portion of said first band is provided with an opening, formed in said second dielectric layer and in said second polysilicon layer, filled at least partially by a conductive layer said portion of said first band having a greater width at the location of said opening than the width at the location of said active areas.

2. The circuit structure according to claim 1, wherein said conductive layer is a polysilicon layer.

3. The circuit structure according to claim 1, wherein said conductive layer is a metallization layer.

4. A device, comprising:
   a semiconductor substrate;
   a first active region of the substrate defined by a first opening in an insulating layer formed on the substrate;
   first and second transistors formed in the first active region of the semiconductor substrate;
   a first portion of a multilayer structure formed, with a first width, over the first transistor and, with a second width, greater than the first width, over a region of the insulating layer, the multilayer structure including a gate oxide layer, a first polysilicon layer, a dielectric layer, and a second polysilicon layer;
   a second portion of the multilayer structure formed over the second transistor, the second portion electrically separate from the first portion;
   an opening formed in the dielectric layer and the second polysilicon layer of the first portion of the multilayer structure, over the region of the insulating layer; and
   a conductive layer formed in the opening and electrically connecting the first and second polysilicon layers of the first portion of the multilayer structure.

5. The device of claim 4, comprising a transition layer formed between the conductive layer and the first polysilicon layer, and between the conductive layer and the second polysilicon layer.

6. The device of claim 4 wherein a region of the gate oxide layer of the second portion of the multilayer structure is a tunnel oxide region of the second transistor.

7. The device of claim 4, comprising a memory matrix of memory cells, wherein the first transistor is a selection transistor of the memory matrix and the second transistor is a floating gate transistor of the memory matrix.

8. The device of claim 7, comprising:
a second active region of the substrate defined by a second opening in the insulating layer formed on the substrate; and
a third transistor formed in the second active region, wherein the first portion of the multilayer structure is formed over the third transistor.

9. The device of claim 8 wherein the third transistor is a byte selection transistor.

10. The device of claim 9, comprising:
a first plurality of selection transistors formed on the substrate, wherein the first transistor is one of the first plurality of selection transistors, and wherein the first portion of the multilayer structure is formed over each of the first plurality of selection transistors; and
a first plurality of floating gate transistors formed on the substrate, wherein the second transistor is one of the first plurality of floating gate transistors, and wherein the second portion of the multilayer structure is formed over each of the first plurality of floating gate transistors.

11. The device of claim 10 wherein:
the memory matrix comprises a plurality of bytes arranged in rows and columns;
the first pluralities of selection transistors and floating gate transistors are components of a first one of the plurality of bytes; and
each of the plurality of bytes comprises a respective plurality of selection transistors, a respective plurality of floating gate transistors and a respective byte selection transistor.

12. A memory matrix formed on a semiconductor substrate and having a plurality of bytes arranged in rows and columns, each byte comprising:
a plurality of memory cells, each memory cell including a selection transistor and a floating gate transistor formed together in one of a plurality of active regions of the substrate;
a byte selection transistor formed in another one of the plurality of active regions of the substrate;
a first segment of a multilayer structure formed to extend, at a first width, over each of the selection transistors of the byte and over the byte selection transistor, and at a second width, greater than the first width, over a portion of an insulating layer formed between two of the plurality of active regions, the multilayer structure including:
a gate oxide layer formed on a surface of the substrate,
a first polysilicon layer formed on the gate oxide layer,
a dielectric layer formed on the first polysilicon layer, and
a second polysilicon layer formed on the dielectric layer;
an opening formed in the dielectric layer and second polysilicon layer in a region of the first segment extending over the portion of the insulating layer;
a conductive layer formed in the opening, electrically coupling the first and second polysilicon layers; and
a second segment of the multilayer structure formed to extend over each of the floating gate transistors of the byte.

13. The memory matrix of claim 12 wherein the second segment of the multilayer structure of each of the plurality of bytes in a same row is a common segment.

14. The memory matrix of claim 12 wherein each byte comprises eight bits.

* * * * *